(12) United States Patent
Flavin et al.

(10) Patent No.: US 10,575,433 B2
(45) Date of Patent: Feb. 25, 2020

(54) ENCLOSURE AND COOLING SYSTEM FOR ELECTRONIC EQUIPMENT

(71) Applicant: Stored Energy Systems, a Limited Liability Company, Longmont, CO (US)

(72) Inventors: John Flavin, Golden, CO (US); Kyle Miller, Arvada, CO (US); Jeff Sorge, Westminster, CO (US); William Kaewert, Longmont, CO (US)

(73) Assignee: Stored Energy Systems, a Limited Liability Company, Longmont, CO (US)

( * ) Notice: Subject to any disclaimer, the term of this patent is extended or adjusted under 35 U.S.C. 154(b) by 0 days.

(21) Appl. No.: 15/951,324

(22) Filed: Apr. 12, 2018

(65) Prior Publication Data

US 2019/0320555 A1 Oct. 17, 2019

(51) Int. Cl.
*H05K 7/20* (2006.01)
*H05K 5/06* (2006.01)
*H05K 7/14* (2006.01)

(52) U.S. Cl.
CPC ......... *H05K 7/20172* (2013.01); *H05K 5/069* (2013.01); *H05K 7/20409* (2013.01); *H05K 7/1427* (2013.01)

(58) Field of Classification Search
CPC .......... H05K 7/20172; H05K 7/20163; H05K 5/069; H05K 7/20409; H05K 7/1427; H05K 7/20736; H05K 7/20145; H05K 7/20918; H05K 7/20809; H05K 7/209; H05K 7/20827; H05K 7/20909; H01L 35/30; G06F 1/20; G06F 2200/201; G06F 1/206; G06F 1/181; F28D 20/021; F24F 11/0001; F24F 7/08
USPC ..... 361/697, 695, 679.46, 679.51, 694, 690, 361/692, 679.54, 679.01, 679.49, 704, 361/724, 679.48, 679.5; 165/104.33, 165/80.3; 257/717; 454/184, 258
See application file for complete search history.

(56) References Cited

U.S. PATENT DOCUMENTS

3,356,903 A * 12/1967 Arnold .................. H04B 1/036
361/690
4,408,661 A 10/1983 Eastman et al.
(Continued)

*Primary Examiner* — Mandeep S Buttar
(74) *Attorney, Agent, or Firm* — James A. Sheridan; Sheridan Law, LLC (57) ABSTRACT

There is disclosed an enclosure and cooling system for electronic equipment that provides forced-air cooling of multiple compartmentalized electronics assemblies while simultaneously isolating the electronics assemblies from the ambient environment, keeping the electronics assemblies free from contamination due to harmful dust, dirt, water, corrosives, and other airborne foreign matter. Embodiments include an air-conduction cooled environmentally-sealed electronics enclosure having at least first and second environmentally-sealed electronics compartments, each containing a respective electronic assembly. A common-air cooling channel containing a fin core is disposed between the first and the second electronics compartments, such that ambient air drawn from an air intake, through the common channel, and out an air exhaust removes heat generated by the electronic assemblies within the sealed compartments to an exterior of the enclosure. Other embodiments are disclosed.

15 Claims, 6 Drawing Sheets

(56) References Cited

U.S. PATENT DOCUMENTS

| | | | |
|---|---|---|---|
| 5,689,403 A * | 11/1997 | Robertson, Jr. | H04B 1/036 |
| | | | 361/695 |
| 6,065,530 A | 5/2000 | Austin et al. | |
| 6,253,834 B1 * | 7/2001 | Sterner | G06F 1/203 |
| | | | 165/104.34 |
| 6,430,042 B1 * | 8/2002 | Ohashi | G06F 1/203 |
| | | | 165/104.33 |
| 6,462,944 B1 * | 10/2002 | Lin | G06F 1/181 |
| | | | 165/80.3 |
| 7,872,864 B2 * | 1/2011 | Mongia | G06F 1/203 |
| | | | 361/694 |
| 2003/0222249 A1 * | 12/2003 | Bunyan | H01L 23/3737 |
| | | | 252/500 |
| 2007/0217157 A1 * | 9/2007 | Shabany | H05K 7/20572 |
| | | | 361/701 |
| 2009/0310301 A1 | 12/2009 | Nelson et al. | |
| 2010/0079940 A1 | 4/2010 | Mongia et al. | |
| 2012/0134114 A1 | 5/2012 | Kamenszky et al. | |
| 2014/0174693 A1 | 6/2014 | Wong et al. | |
| 2014/0254095 A1 * | 9/2014 | Horng | G06F 1/28 |
| | | | 361/692 |
| 2015/0013941 A1 | 1/2015 | Wong et al. | |

\* cited by examiner

ENCLOSURE AND COOLING SYSTEM FOR ELECTRONIC EQUIPMENT

BACKGROUND

Electrical and electronic circuits and devices create waste heat as a byproduct of their function. Careful design and component selection can reduce, but not completely eliminate such waste heat. Currently, prior art electronic assemblies employ one of several different cooling mechanisms designed to prevent thermal overstress of components and assemblies, as discussed below.

Natural Convection

Natural convection cooling of an open-chassis enclosure design is the simplest cooling method. This method allows the free flow of atmosphere around internal electronic components, allowing transfer of heat into the environment. Because this method does not employ forced air, the density of packaging in terms of watts per cubic inch compared to other alternatives is unfavorable. This method is also vulnerable to the ingress of atmospheric contaminants such as dirt and salt fog because the housing contains a large number of openings that enable a free flow of cooling air to contact heat-dissipating components inside the enclosure. Accumulation of atmospheric contaminants is known to cause premature failure of electrical and electronic systems via many failure mechanisms that include short circuits between adjacent printed circuit board traces or component leads and corrosion of current carrying traces, terminals, and fasteners.

External Fins

The locations in which some electronic assemblies are operated demand that the electronic assemblies' components and printed circuits be protected from atmospheric contaminants to avoid premature system failure caused by the atmospheric contamination effects described above. One approach to achieve this protection is to seal the electronic assembly's active components inside a thermally-conductive box. In such designs, heat-dissipating components are thermally bonded to the external surface of the box or enclosure. Large fins on external surfaces of the box increase the surface area of the box, which increases the rate at which heat transfers from the box into the surrounding atmosphere. The problematic size and space requirements, mass, and cost of external fins can be reduced if air is forced or blown across the fins.

Forced-Air Cooling

Commonly available packaging densities of electronic components onto microcircuits and onto printed circuit assemblies typically exceed the ability of natural convection cooling to extract sufficient waste heat. Cooling more densely packaged electronic assemblies requires either liquid cooling or some form of forced-air cooling. Prior art electronic assemblies employing forced-air cooling are similar to the open chassis design discussed above, except that a fan or blower is installed inside the electronic assembly's chassis, and enclosure openings of the electronic assembly are tailored to optimize airflow through the enclosure and across heat-dissipating components. The fan or blower significantly increases the velocity and volume of air that passes over heat-dissipating components inside the electronic assembly. This increases the rate of heat transfer from the heat-dissipating components into the atmosphere. Forced-air cooling is highly cost-effective because the size, and therefore the cost, of heat sinks and total package size can be considerably smaller than convection cooled designs of the same power rating.

Prior art forced-air cooling, however, is even more vulnerable than open-frame natural convection cooled designs to the ingress of atmospheric contaminants such as dirt and salt fog. In prior art forced-air cooled designs, the fan significantly increases the rate at which contaminant laden air enters the electronic assembly. Compared to natural convection cooled electronic assembly designs, the greater speed and volume of contaminated air entering the prior art force cooled electronic assembly enclosure significantly accelerates the rate at which electronic assembly failure occurs due to internal short circuit and corrosion damage. In addition, some of the dirt pumped through the converter by high speed airflow accumulates on heat-dissipating components. Accumulating dirt creates a thermal blanket that hinders fan-assisted air flow from effectively cooling the components on which dirt buildup occurs. Electronic components running at higher temperatures typically fail sooner than cooler running components. Thus, prior art fan cooled electronic assemblies are subject to premature failure from both the internal short circuit and the overheating of components.

Liquid Cooling

Liquid cooling schemes employ coolant channels located adjacent to heat-dissipating components within the enclosure. Liquid cooling thus simultaneously enables both high power density and protection from environmental contaminants. Unfortunately, liquid cooling systems require a remote heat exchanger and are subject to coolant leaks. As a result, liquid cooling is ideal for use on platforms such as vehicles that already employ liquid cooling. In other applications such as, for example, power plants, substations, communication facilities, and other sites where high voltages or exposed electrical terminals or storage batteries are located, liquid cooled power converters are typically unacceptable due to the complexity and cost of remote radiators and the safety and reliability risks related to coolant leaks.

As a result, existing cooling mechanisms for electronic circuits and devices present a number of efficacy, environmental contamination, complexity, cost, and safety challenges that have not been addressed in the prior art.

SUMMARY

This Summary is provided to introduce a selection of concepts in a simplified form that are further described below in the Detailed Description. This Summary is not intended to identify key aspects or essential aspects of the claimed subject matter. Moreover, this Summary is not intended for use as an aid in determining the scope of the claimed subject matter.

One embodiment provides an air-conduction cooled environmentally-sealed electronics enclosure. The electronics enclosure may include (1) a first environmentally-sealed electronics compartment containing a first electronic assembly; (2) a second environmentally-sealed electronics compartment containing a second electronic assembly; (3) a common air-cooling channel disposed between the first and the second environmentally-sealed electronics compartments, the common air-cooling channel extending from an air intake to an air exhaust; and (4) an air mover disposed at one of the air intake and the air exhaust, the air mover configured to move an ambient airflow into the air intake, through the common air-cooling channel, and out the air exhaust.

Another embodiment provides a system for simultaneously air-conduction cooling and environmentally isolating multiple electronics assemblies. The system may include (1) a heat-exchanger assembly comprising a first thermally-conductive sheet and a second thermally-conductive sheet, the first and the second thermally-conductive sheets defining a common air-cooling channel therebetween; (2) an enclosure enclosing the heat-exchanger assembly; (3) an ambient air intake formed through the enclosure at a first end of the common air-cooling channel; (4) an air exhaust formed through the enclosure at a second end of the common air-cooling channel; and (5) an air mover disposed at the air intake or the air exhaust, where (a) the first thermally-conductive sheet and the enclosure combine to define a first environmentally-sealed electronics compartment containing a first electronic assembly; (b) the second thermally-conductive sheet and the enclosure combine to define a second environmentally-sealed electronics compartment containing a second electronic assembly; and (c) the air mover is configured to generate a low turbulence airflow into the air intake, through the common air-cooling channel, and out the air exhaust.

Yet another embodiment provides a method of cooling an electronics enclosure. The method may include (1) forming a common air-cooling channel through an interior of the electronics enclosure, the common air-cooling channel having an ambient air intake and an air exhaust; (2) sealing a first electronics compartment on a first side of the common air-cooling channel; (3) sealing a second electronics compartment on a second side of the common air-cooling channel; and (4) moving ambient air through the common air-cooling channel from the air intake to the air exhaust to simultaneously remove heat generated within the first and the second electronics compartments to an exterior of the electronics enclosure.

Other embodiments are also disclosed.

Additional objects, advantages and novel features of the technology will be set forth in part in the description which follows, and in part will become more apparent to those skilled in the art upon examination of the following, or may be learned from practice of the technology.

BRIEF DESCRIPTION OF THE DRAWINGS

Non-limiting and non-exhaustive embodiments of the present invention, including the preferred embodiment, are described with reference to the following figures, wherein like reference numerals refer to like parts throughout the various views unless otherwise specified. Illustrative embodiments of the invention are illustrated in the drawings, in which.

DETAILED DESCRIPTION

Embodiments are described more fully below in sufficient detail to enable those skilled in the art to practice the system and method. However, embodiments may be implemented in many different forms and should not be construed as being limited to the embodiments set forth herein. The following detailed description is, therefore, not to be taken in a limiting sense.

Various embodiments of the systems and methods described herein relate to a novel enclosure and cooling system for electronic equipment including electrical circuit boards and their attached heat-generating components. The unique enclosure design provides forced-air, conduction cooling of electronic assemblies disposed within multiple electronics compartments while simultaneously isolating the electronics from the outside elements to keep the electronic components free from contamination due to harmful dust, dirt, water, corrosives and other airborne foreign matter. Additionally, enclosing the electronic equipment within sealed compartments, without ventilation openings, reduces radiated electrical noise or electromagnetic energy.

As discussed above in the Background section, direct air cooling of electronic circuit boards and their components presents inherent limitations because outside ambient air is brought inside the electronics enclosure through openings in the enclosure to remove heat from the electrical components and prevent component thermal failure. Generally, ambient air is applied by fans or gravity flow to the components or to internal component heat sinks that provide an increase in surface area to the hot components. This direct cooling airflow introduces damaging contaminants from the outside environment in that the airflow that enters the system impinges directly upon the electrical printed circuit boards (PCBs) and attached components and deposits contaminants from the outside environment onto the PCBs and attached components. This contamination leads to premature failure of the electronics, most often by introducing contaminants that are or become conductive with atmospheric moisture. With sufficient time, the contaminant-laden airflow may create short circuits between adjacent PCB traces or component leads, causing premature failure of the device. Outside airborne contaminants ingested by the equipment can also produce component thermal failure by accumulating debris on the surfaces of the active electronic components or the heat-dissipating components, adding thermal insulation. This added insulation causes the electronic components to operate at temperatures that are higher than designed, thereby causing a shortened lifetime from thermal overstress.

While mechanisms other than direct air flow may be used to cool PCBs and attached components, those options present their own challenges. For example, air cooling one or more finned or smooth exterior surfaces of a thermally-conductive enclosure prevents environmental contamination of the electronics contained therein, but the approach is space consumptive and does not allow for a desired density of active electronic components within the enclosure due to its less effective cooling properties. Further, while liquid cooled systems may enable high power density and environmental protection, they are complex and costly systems that require remote heat exchangers and are prone to leakage, rendering them impractical for many electronics enclosure environments.

Embodiments of an electronics enclosure and cooling system disclosed herein provide a mechanism that simultaneously avoids the complexity, reliability, and safety risks inherent to liquid cooled designs, exploits the high-power density benefits of forced-air cooled designs, and provides protection from environmental contaminants similar to sealed convection cooled designs. The enclosure and cooling system thermally attaches two or more sealed electronics compartments to a common heat sink through which cooling air is blown or drawn, thereby delivering a power density rivaling force-cooled converters, but without the corresponding vulnerability to environmental contamination.

Figure 1:
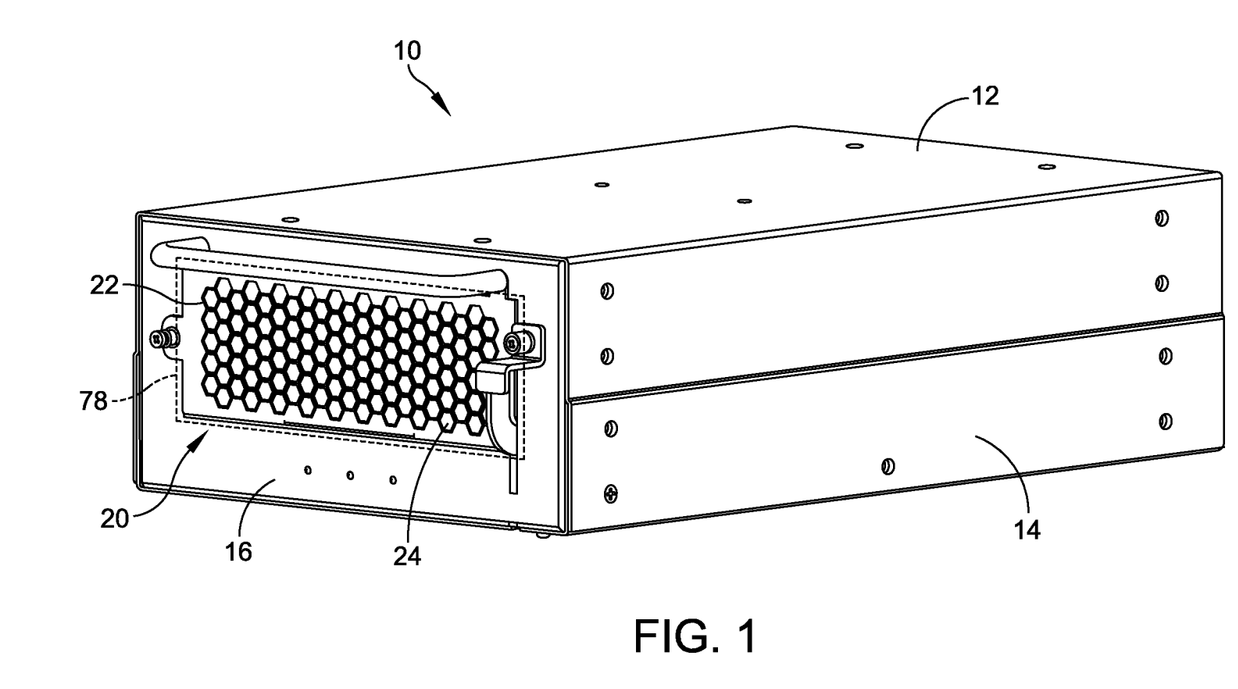
FIG. 1 illustrates a front perspective view of one embodiment of a sealed, air-conduction cooled electronics enclosure.
Figure 2:
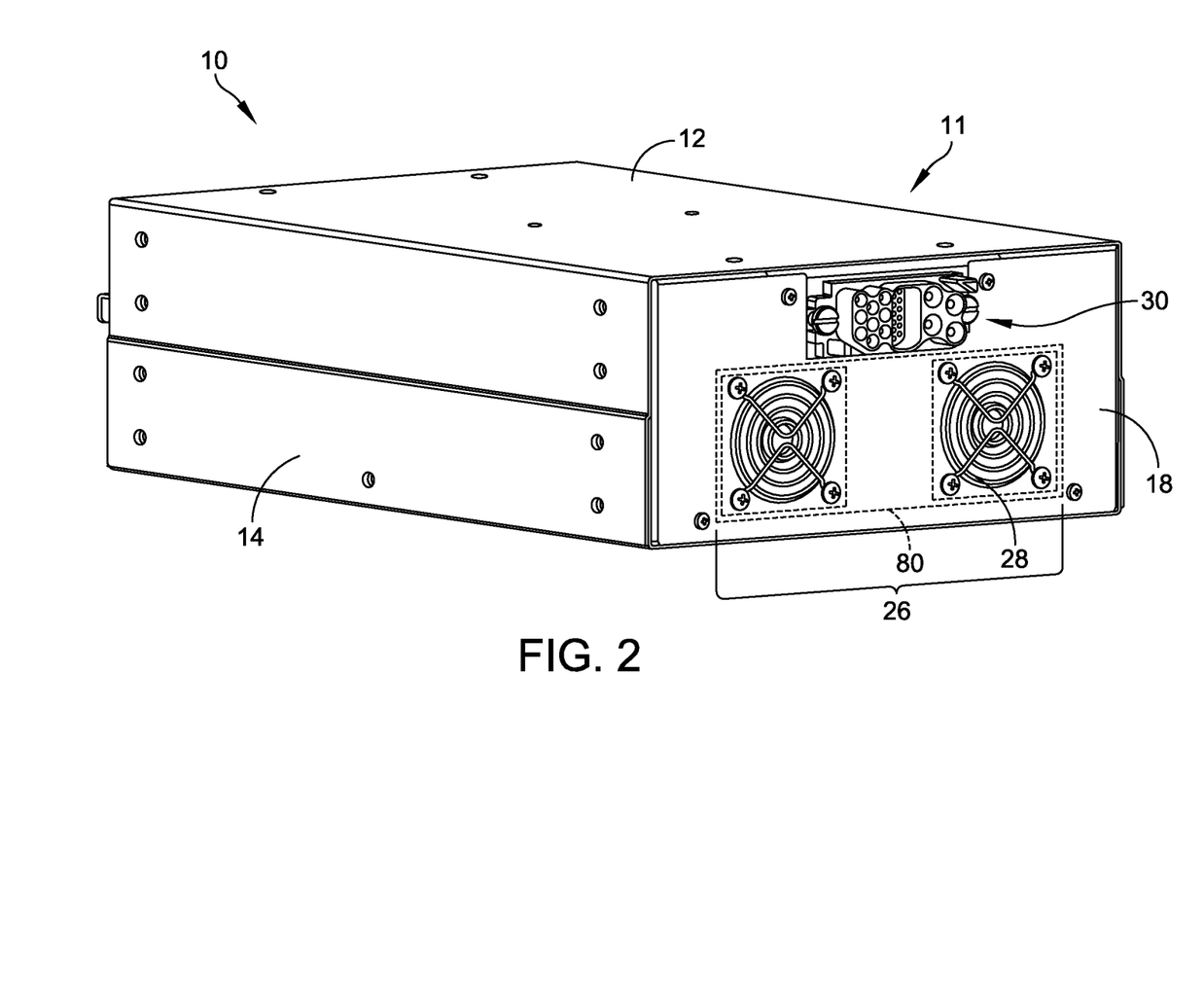
FIG. 2 illustrates a rear perspective view of the sealed, air-conduction cooled electronics enclosure of FIG. 1.

Turning to exemplary embodiments, FIGS. 1-2 illustrate front and rear perspective views of one embodiment of a sealed, air-conduction cooled electronics enclosure 10. In this embodiment, the enclosure 10 may include a cover 11 having first and second cover sections 12, 14, as well as front and rear plates 16, 18. The first and the second cover sections 12, 14 and the front and the rear plates 16, 18 may be precision formed such that they seal about the contents of the enclosure 10, discussed below.

The front plate 16 may feature an air intake 20 having a grill 22 and an air filter 24, which may be a commercially available air filter that is both user serviceable and user-replaceable. The rear plate 18 may feature an air exhaust section 26 having two fans 28 operating in parallel to draw ambient air into the air intake 20, through a heat exchanger contained within the enclosure 10, and out the fan exhaust section 26. The rear plate 18 may also include appropriate input/output connections 30 that electrically connect the internal electronic assemblies, discussed below, with the outside world in a manner that prevents environmental contamination from entering the enclosure (e.g., via passing electrical conductors through sealed enclosure walls or employing sealed tubes, sealed connectors, polymeric boots, expanding polymeric sealant, and/or other appropriate I/O connection means).

Figure 3:
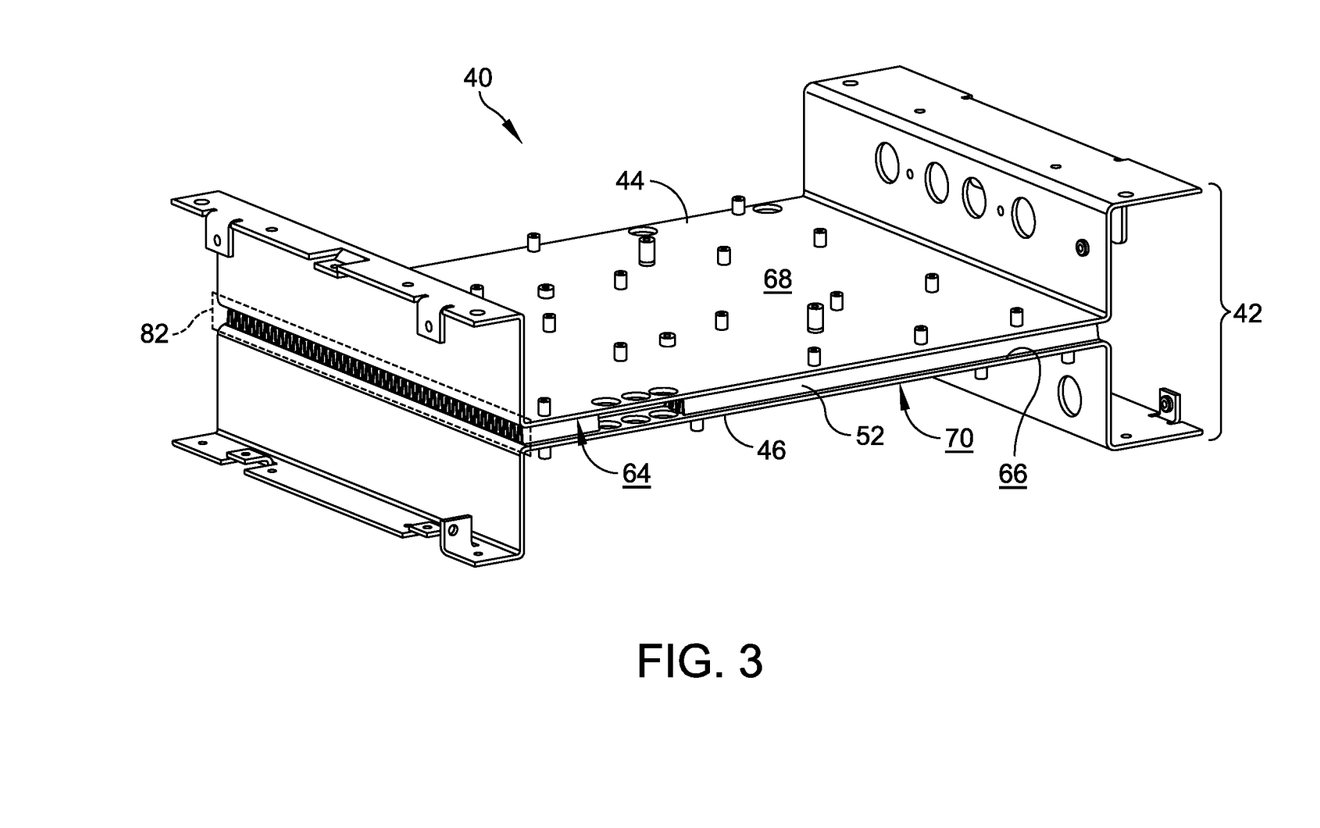
FIG. 3 illustrates a perspective view of one embodiment of a heat-exchanger assembly of the electronics enclosure of FIG. 1.
Figure 4:
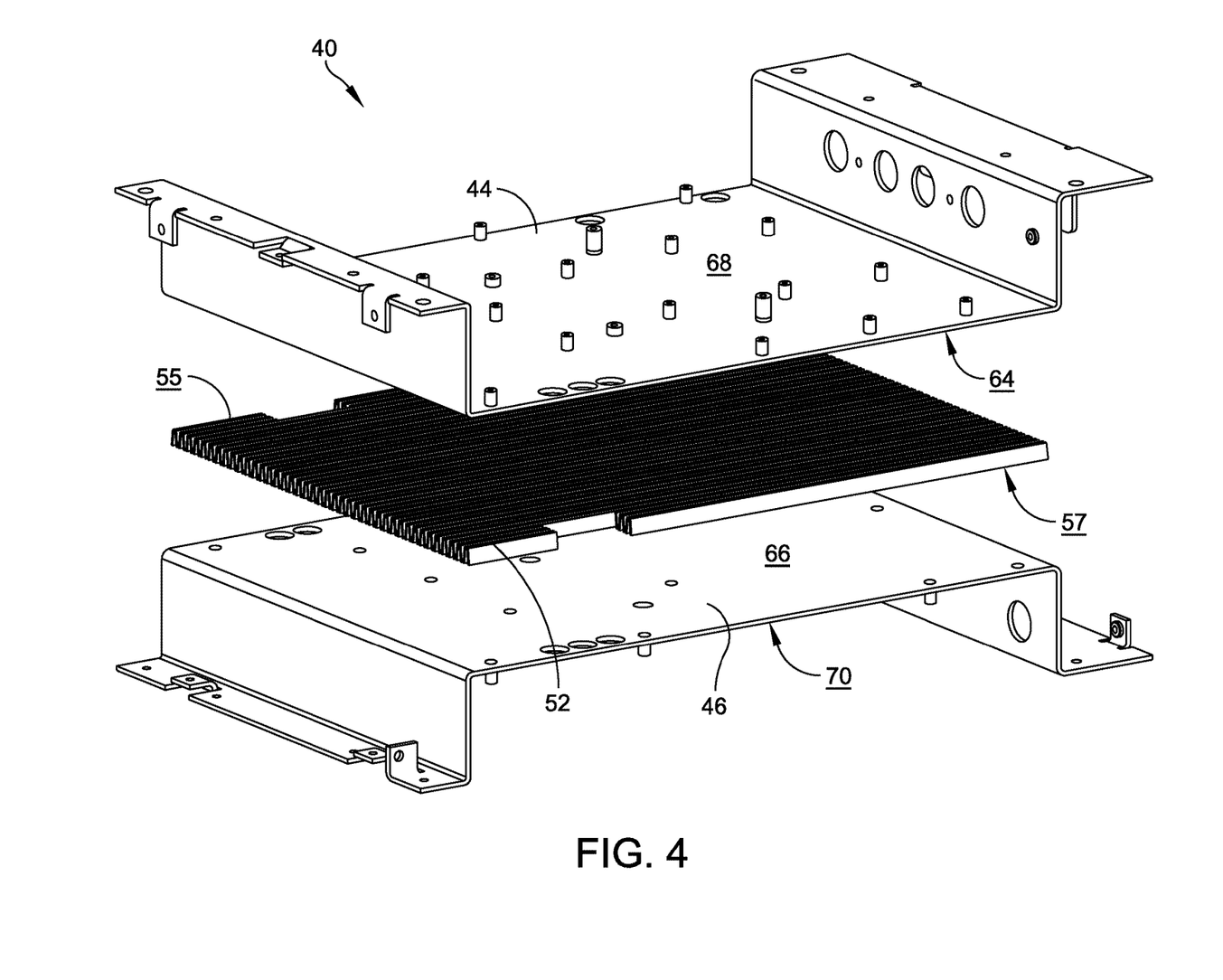
FIG. 4 illustrates an exploded view of the heat-exchanger assembly of FIG. 3.
Figure 5:
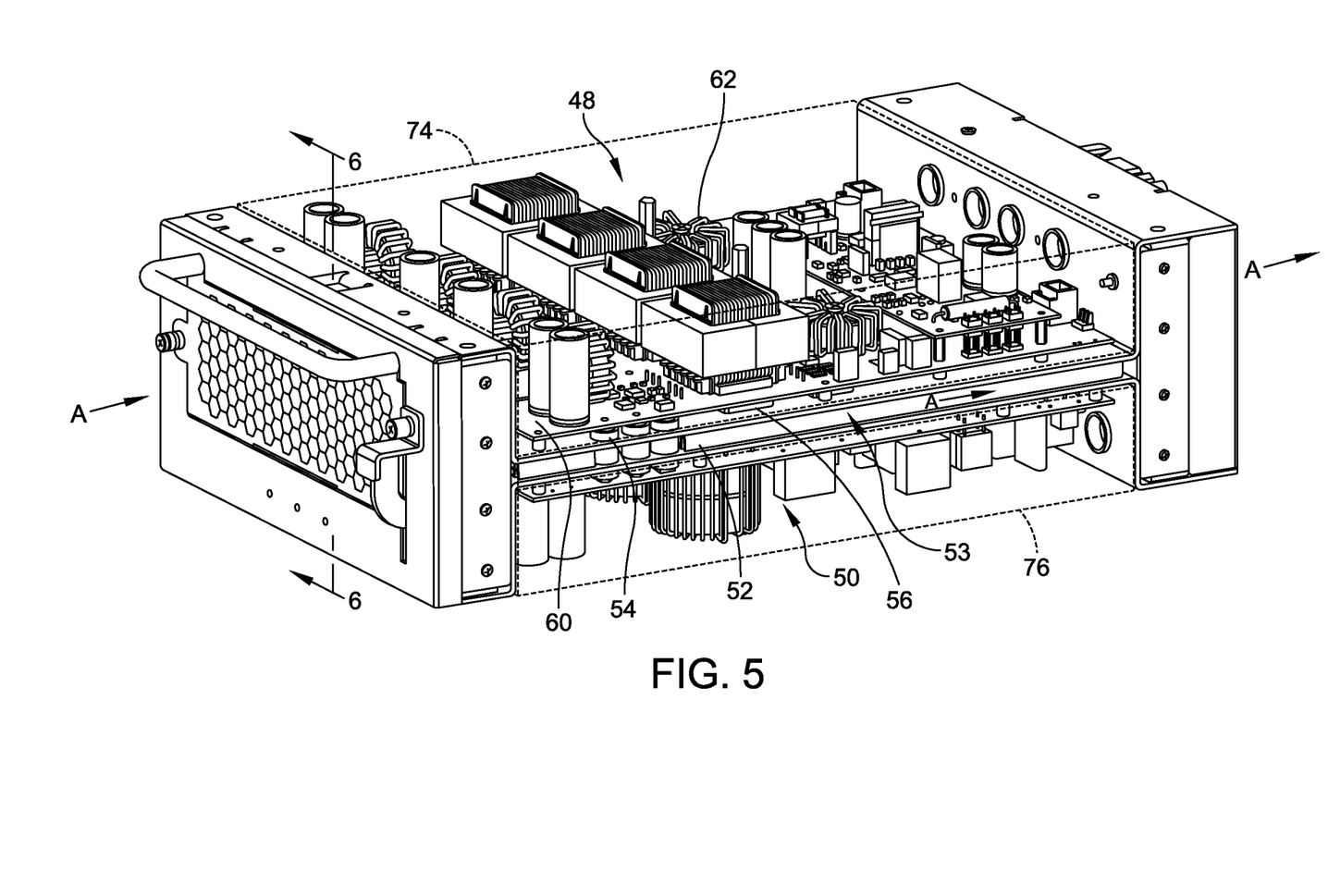
FIG. 5 illustrates a perspective view of the sealed, air-conduction cooled electronics enclosure of FIG. 1, with first and second cover sections removed.
Figure 6:
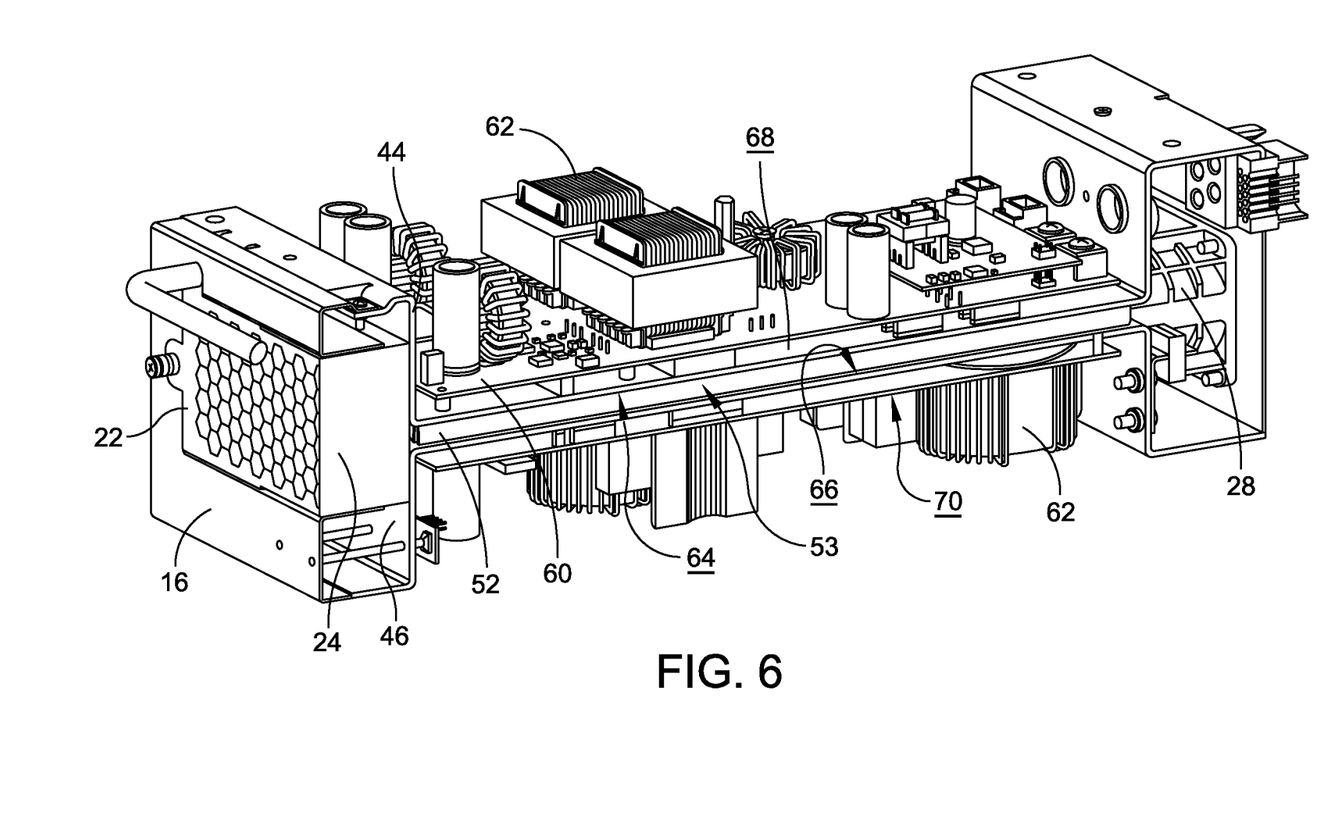
FIG. 6 illustrates a cross-sectional view of the air-conduction cooled electronics enclosure, with the first and the second cover sections removed, of FIG. 5.

FIGS. 3-4 illustrate perspective and exploded views, respectively, of one embodiment of a heat-exchanger assembly 40 of the sealed, air-conduction cooled electronics enclosure 10. FIGS. 5-6 illustrate perspective and cross-sectional views of first and second electronics assemblies 48, 50 mounted upon the heat-exchanger assembly 40. Embodiments of the electronics assemblies may include one or more PCBs 60 and a plurality of attached active, heat-generating electronic components 62.

In this embodiment, the heat-exchanger assembly 40 includes a rigid heat-sink frame 42 that both provides structural support for the mounted electronic assemblies 48, 50 and transfers heat away from those mounted electronic assemblies 48, 50. In further detail, the heat-sink frame 42 may include first and second thermally-conductive walls or sheets 44, 46, each of the sheets 44, 46 having a respective first surface 64, 66 that faces opposite the corresponding electronic assembly 48, 50 and an opposing second surface 68, 70 that is disposed adjacent the corresponding electronic assembly 48, 50. The first surface 64 of the first thermally-conductive sheet 44 may be thermally bonded to a first side 55 of a fin core 52, while the first surface 66 of the second thermally-conductive sheet 46 may be thermally bonded to a second side 57 of the fin core 52, such that the fin core 52 is positioned within a common air-cooling channel 53 that is formed between the opposing thermally-conductive sheets 44, 46.

In this embodiment, the fin core 52 is constructed of formed sheet metal fins that are square or rectangular in shape. Other embodiments of the fin core 52 may be constructed from a variety of styles and shapes of formed sheet metal fins such as triangular fins, zipper fins, or bonded fins. The fin density, fin height, and fin thickness may each be adjusted to optimize the cooling rate for given airflow and thermal load conditions. In one embodiment, the fin core 52 may be substituted with rigid metal foam as a heat transfer medium. In another embodiment, the fin core 52 may be substituted with a liquid cooled plate, a phase change cooling system, or a plurality of heat pipes.

The first electronic assembly 48 may be mounted to the second surface 68 of the first thermally-conductive sheet 44, and the second electronic assembly 50 may be mounted to the second surface 70 of the second thermally-conductive sheet 46, along with a plurality of thermally conductive gap fillers 56 that are in thermal contact between the heat producing and dissipating components 62 of the assemblies 48, 50 and the thermally-conductive sheets 44, 46 of the heat-sink frame 42. The thermally conductive gap fillers 56 are both thermally-conductive and electrically insulating. In one embodiment, the thermally conductive gap fillers 56 may be flexible pads that enable a repeatable and reliable bond between the heat producing components 62 and the thermally-conductive sheets 44, 46 of the heat-sink assembly 40 in a manner that accommodates normal manufacturing tolerance variations.

Installing the cover 11, including the first and the second cover sections 12, 14 and the front and the rear plates 16, 18, about the heat-exchanger assembly 40 and the mounted first and second electronic assemblies 48, 50 results in sealed first and second electronics compartments 74, 76 (FIG. 5) disposed upon either side of the common air-cooling channel 53.

During use, the fans 28 operate to draw air into the front ambient air intake 20 and through the finned, common air-cooling channel 53 disposed between the first and the second electronic assemblies 48, 50, before it is exhausted out of the rear exhaust section 26, along arrow A of FIG. 5. The airflow, A, through the common air-cooling channel 53 removes heat from the first and the second thermally-conductive sheets 44, 46, which, in turn, remove heat from the thermally attached, heat producing electronic assemblies 48, 50. The thermal conduction path between the heat-producing electrical components 62 and the cooling airflow, A, is kept as short as possible to minimize the total thermal resistance and, thus, the temperature rise of the components 62. This low thermal resistance in the thermal path from the components 62 to the cooling airflow, A, maximizes the thermal efficiency of the cooled electronics enclosure 10.

Performance of the heat-exchanger assembly 40 relies on an adequate airflow, A, through the fin core 52, as inadequate airflow, A, slows or prevents the transfer of heat from the electronic assemblies 48, 50. To ensure proper airflow, A, the common air-cooling channel 53 may have a smaller cross-sectional area 82 (FIG. 3) than either a cross-sectional area 78 of the air intake 20 (FIG. 1) or a cross-sectional area 80 of the exhaust section 26 (FIG. 2) to increase the airflow velocity, and therefore the cooling capacity, of the airflow, A, through the cooling channel 53. Further, while this embodiment of the enclosure 10 is described as including two fans 28 operating in parallel in the exhaust section 26 to reduce the load that any single fan must to overcome, to increase fan lifespan, and to ensure continued operation in the event of a single fan failure, additional or fewer fans may be employed as appropriate. Moreover, any appropriate air mover may be employed to generate the airflow, A. For example, a blower could be substituted to move air through the common air-cooling channel 53.

Notably, the first and the second sealed electronics compartments 74, 76 (FIG. 5) are located on the clean sides of the air-cooling channel 53, away from the direct airflow, A, through the channel 53. If necessary, electrical connection between the first and the second electronics compartments 74, 76 may be accomplished by passing electrical conductors through the heat-exchanger assembly 40 from one sealed compartment to another sealed compartment through polymeric pass-through tubes 54 such that environmental contamination cannot enter the sealed compartments 74, 76. Such a pass through may be accomplished via any appropriate sealed tubes, sealed connectors, polymeric boots, expanding polymeric sealant, or other sealed connection means. As a result, the electronic assemblies 48, 50 housed within the first and the second electronics compartments 74, 76 are isolated from user contact, from the airflow, A, and from the ambient environment. As such, the electronic assemblies 48, 50 are protected from environmental contamination, while at the same time experiencing the heat-dissipating effects of forced-air cooling that brings cooling air into close proximity of the heat-producing components 62 in a compact, space-saving, cost-effective design that accommodates two or more electronic assemblies within the separate electronics compartments 74, 76. Further, embodiments of the cover 11 may be modified to increase the level of environmental sealing. For example, additional O-rings and/or gaskets may be fitted to the cover 11 to render the enclosure resistant to submersion in water.

When compared to existing forced-air cooled electronic enclosures with ventilation holes, embodiments of the sealed, air-conduction cooled electronics enclosure 10 also have the potential to improve the device's electromagnetic performance. Power converters, computers, and other electronic devices that include high frequency switching of electrical power emit radio frequency (RF) energy as a byproduct of their operation. Enclosing electronics within the sealed metal boxes/compartments (i.e., Faraday cages) reduces the amount of undesirable RF energy that is emitted into the environment from the device. Similarly, the enclosure 10 has the potential to reduce the vulnerability of the electronics inside the sealed compartments 74, 76 from damage due to high power external electric and radio frequency fields.

To maximize heat exchange to and from the heat-exchanger assembly 40, components of the heat-exchanger assembly 40 may be formed of materials having a high thermal conductivity such as, for example, aluminum and/or copper. Other components of the enclosure 10, such as the first and the second cover sections 12, 14 and the front and the rear plates 16, 18 may be formed of precision formed, thermally-conductive sheet metal of any appropriate thickness.

While the embodiments described herein present two sealed electronics compartments disposed upon either side of a common air-cooling channel, as shown in FIGS. 5-6, an ordinarily skilled artisan will understand that a variety of configurations of the sealed, air-conduction cooled electronics enclosure are contemplated. For example, two air-cooling channels could be positioned upon either side of a single, common sealed electronics compartment containing two inward-facing electronic assemblies. Further, the common air-cooling channel may support more than two sealed electronics compartments in that the enclosed space on either side of the heat-exchanger assembly 40 may be divided into any number of appropriate sealed compartments.

Although the above embodiments have been described in language that is specific to certain structures, elements, compositions, and methodological steps, it is to be understood that the technology defined in the appended claims is not necessarily limited to the specific structures, elements, compositions and/or steps described. Rather, the specific aspects and steps are described as forms of implementing the claimed technology. Since many embodiments of the technology can be practiced without departing from the spirit and scope of the invention, the invention resides in the claims hereinafter appended.

What is claimed is:

1. An air-conduction cooled contaminant-protected electronics enclosure, comprising:
    a front plate, a rear plate, and a cover forming the air-conduction cooled contaminant-protected electronics enclosure, the front plate, the rear plate, and the cover configured to prevent environmental contamination from entering the air-conduction cooled contaminant-protected electronics enclosure;
    a first environmentally-sealed electronics compartment having a first interior portion containing a first electronic assembly;
    a second environmentally-sealed electronics compartment having a second interior portion containing a second electronic assembly;
    an contaminant-protected common air-cooling channel disposed between the first and the second environmentally-sealed electronics compartments, the contaminant-protected common air-cooling channel extending from an air intake in the front plate to an air exhaust in the rear plate, and the contaminant-protected common air-cooling channel including a heat exchanger assembly;
    an air filter disposed at the air intake in the front plate, and the air filter, the front plate, the cover, and the rear plate configured to provide the air-conduction cooled contaminant-protected electronics enclosure; and
    an air mover disposed at the air exhaust, the air mover configured to move ambient air from an ambient environment into the air intake, through the air filter, through the contaminant-protected common air-cooling channel, and out the air exhaust, wherein the heat exchanger assembly comprises:
        a first thermally-conductive sheet in thermal communication with the first environmentally-sealed electronics compartment and the first electronic assembly;
        a second thermally-conductive sheet in thermal communication with the second environmentally-sealed electronics compartment and the second electronic assembly;
        a fin core disposed between the first and the second thermally-conductive sheets, the fin core comprising a plurality of fins, each in contact with the first and the second thermally-conductive sheets;
        a first thermal conduction path between the first interior portion of the first environmentally-sealed electronics compartment and the contaminant-protected common air cooling channel;
        a second thermal conduction path between the second interior portion of the second environmentally-sealed electronics compartment and the contaminant-protected common air cooling channel; and
a filtered airflow fluidly isolated from the first and the second interior portions of the first and the second electronic compartments, the filtered airflow from the air filter, through the contaminant-protected common air-cooling channel, and out the air exhaust.

2. The air-conduction cooled environmentally-sealed electronics enclosure of claim 1, further comprising a plurality of heat-dissipating components coupled between the first electronic assembly and the first thermally-conductive sheet and between the second electronic assembly and the second thermally-conductive sheet, wherein each of the plurality of the heat-dissipating components are thermally coupled using a plurality of thermally conductive gap fillers that are both thermally-conductive and electrically insulating.

3. The air-conduction cooled environmentally-sealed electronics enclosure of claim 2, wherein the plurality of the heat-dissipating components comprises a plurality of heat-generating electronic components electrically coupled with the first and the second electronic assemblies.

4. The air-conduction cooled environmentally-sealed electronics enclosure of claim 1, wherein a cross-sectional area of the contaminant-protected common air-cooling channel is smaller than a cross-sectional area of the air intake and smaller than a cross-sectional area of the air exhaust.

5. The air-conduction cooled environmentally-sealed electronics enclosure of claim 1, wherein the air agitator comprises a fan disposed at the air exhaust, the fan configured to draw the filtered airflow into the air intake, through the air filter, through the contaminant-protected common air-cooling channel, and out the air exhaust.

6. A system for simultaneously air-conduction cooling and environmentally-isolating multiple electronics assemblies, comprising: a heat-exchanger assembly comprising a first thermally-conductive sheet and a second thermally-conductive sheet, the first and the second thermally-conductive sheets defining a contaminant-protected common air-cooling channel therebetween, wherein the contaminant-protected common air-cooling channel houses a fin core, the fin core formed from a plurality of thermally-conductive fins in contact with the first and the second thermally-conductive sheets; an enclosure enclosing the heat-exchanger assembly, the enclosure configured to prevent environmental contamination from entering the multiple electronics assemblies and the heat-exchanger assembly; an ambient air intake formed through the enclosure at a first end of the contaminant-protected common air-cooling channel; an air filter disposed adjacent to the ambient air intake; an air exhaust formed through the enclosure at a second end of the common air-cooling channel; and an air mover disposed at the air exhaust, wherein: the first thermally-conductive sheet and the enclosure combine to define a first environmentally-sealed electronics compartment containing a first electronic assembly; the second thermally-conductive sheet and the enclosure combine to define a second environmentally-sealed electronics compartment containing a second electronic assembly; and the air mover generates a filtered airflow into the air intake, through the air filter, through the contaminant-protected common air-cooling channel, and out the air exhaust, the filtered airflow fluidly isolated from the first and the second electronic assemblies; wherein a cross-sectional area of the contaminant-protected common air-cooling channel is smaller than a cross-sectional area of the air intake and smaller than a cross-sectional area of the air exhaust.

7. The system of claim 6, wherein the enclosure comprises a first cover section adjacent to the first environmentally-sealed electronics compartment, a second cover section adjacent to the second environmentally-sealed electronics compartment, a front plate housing the air intake, and a rear plate housing the air exhaust.

8. The system of claim 6, wherein the air mover comprises one or more fans disposed at the air exhaust, the one or more of the fans configured to draw the filtered airflow into the air intake, through the air filter, through the contaminant-protected common air-cooling channel, and out the air exhaust.

9. The system of claim 6, wherein the first and the second electronic assemblies each comprise a plurality of active heat-dissipating electronic components that are electrically coupled with one or more printed circuit boards.

10. The system of claim 9, further comprising a plurality of thermally conductive gap fillers coupled between the heat-dissipating electronic components of the first electronic assembly and the first thermally-conductive sheet and between the heat-dissipating electronic components of the second electronic assembly and the second thermally-conductive sheet.

11. The system of claim 10, wherein each of the plurality of the thermally conductive gap fillers is both thermally-conductive and electrically insulating.

12. A method of cooling an electronics enclosure, comprising: forming an a contaminant-protected common air-cooling channel through an interior of the electronics enclosure, the contaminant-protected common air-cooling channel having an ambient air intake and an air exhaust and housing a fin core; sealing a first electronic assembly within a first electronics compartment on a first side of the contaminant-protected common air-cooling channel, the first electronics compartment in thermal contact with the fin core; sealing a second electronic assembly within a second electronics compartment on a second side of the contaminant-protected common air-cooling channel, the second electronics compartment in thermal contact with the fin core; disposing an air filter between the ambient air intake and the contaminant-protected common air-cooling channel; and moving a filtered airflow through the contaminant-protected common air-cooling channel from the air intake, through the air filter, and to the air exhaust, thereby simultaneously (1) removing heat generated within the first and the second electronics compartments to an exterior of the electronics enclosure, (2) protecting the first electronic assembly and the second electronic assembly, from all external environmental exposure, and (3) protecting the fin core from contaminant exposure with the electronics enclosure, including the air filter, ambient air intake, and the air exhaust; and wherein the common air-cooling channel has a cross-sectional area that is smaller than a cross-sectional area of the air intake and smaller than a cross-sectional area of the air exhaust.

13. The method of claim 12:
wherein the first and the second electronic assemblies each comprise a printed circuit board having a plurality of active heat-generating electronic components.

14. The method of claim 13, wherein the contaminant-protected common air-cooling channel is formed by a first thermally-conductive wall positioned adjacent to the first electronics compartment and a second thermally-conductive wall positioned adjacent to the second electronics compartment, the method further comprising:
installing a first plurality of thermally conductive gap fillers in thermal contact with the first electronic assembly and the first thermally-conductive wall; and installing a second plurality of thermally conductive gap fillers in thermal contact with the second electronic assembly and the second thermally-conductive wall.

15. The method of claim 14, wherein the fin core comprises a plurality of fins, each of the plurality of the fins in contact with the first and the second thermally-conductive walls.

* * * * *